United States Patent [19]
DeLisle et al.

[11] Patent Number: 5,237,224
[45] Date of Patent: Aug. 17, 1993

[54] VARIABLE SELF-CORRECTING DIGITAL DELAY CIRCUIT

[75] Inventors: Francis A. DeLisle, Wappingers Falls, N.Y.; Alfred M. Jacoutot, Winooski, Vt.

[73] Assignee: International Business Machines Corporation, Armonk, N.Y.

[21] Appl. No.: 850,215

[22] Filed: Mar. 12, 1992

Related U.S. Application Data

[63] Continuation of Ser. No. 595,518, Oct. 11, 1990, abandoned.

[51] Int. Cl.$^5$ .................. H03K 5/13; H03K 5/159
[52] U.S. Cl. .............................. 307/603; 307/591; 307/269; 307/602; 328/55; 328/63
[58] Field of Search .............. 307/603, 601, 602, 269; 328/55, 63, 72; 377/39, 56

[56] References Cited

U.S. PATENT DOCUMENTS

| | | | |
|---|---|---|---|
| 3,725,793 | 4/1978 | Phillips | 328/63 |
| 4,346,343 | 8/1982 | Berndlmaier et al. | 307/595 |
| 4,504,749 | 3/1985 | Yoshida | 307/602 |
| 4,524,448 | 6/1985 | Hüllwegen | 328/63 |
| 4,637,018 | 1/1987 | Flora et al. | 371/1 |
| 4,714,924 | 12/1987 | Ketzler | 307/602 |
| 4,745,310 | 5/1988 | Swapp | 328/55 |
| 4,755,704 | 7/1988 | Flora et al. | 307/602 |
| 4,868,430 | 9/1989 | Stewart | 307/602 |
| 4,870,665 | 9/1989 | Vaughn | 377/39 |

FOREIGN PATENT DOCUMENTS

| | | |
|---|---|---|
| 0181047 | 5/1986 | European Pat. Off. . |
| 0229726 | 7/1987 | European Pat. Off. . |
| 0306662 | 12/1988 | European Pat. Off. . |
| 0311237 | 4/1989 | European Pat. Off. . |
| 2040628 | 1/1979 | United Kingdom . |

OTHER PUBLICATIONS

IBM Technical Disclosure Bulletin, vol. 30, No. 2, Jul. 1987, J. H. Chang et al. "Scheme for Reducing Clock Skew in Multiple-Chip System Design".

*Primary Examiner*—Timothy P. Callahan
*Attorney, Agent, or Firm*—Henri Daniel Schnurmann

[57] ABSTRACT

A variable self-correcting on-chip circuit comprised of a plurality of digital circuit components is described, whereby electrical signals are precisely positioned with respect to one another. Electrical signals are converted into a number of pulses within a predefined time window. A first number of pulses obtained from free on-chip circuit oscillation is compared to a second number of pulses derived from a predetermined delay defined by the user. An unequal comparison generates control signals capable of advancing or retarding electrical signals. The delay adjustments account for technology, process, temperature and power supply variations. The compounded effect of these variations translates into a certain delay for which self-correction takes effect.

12 Claims, 3 Drawing Sheets

FIG. 1

VARIABLE SELF-CORRECTING DIGITAL DELAY CIRCUIT

This patent application is a continuation to U.S. patent application Ser. No. 07/595,518 filed on Oct. 11, 1990, now abandoned.

FIELD OF THE INVENTION

This invention relates to a variable self-correcting digital delay signal generating circuit which adds and subtracts delay values in precise increments in order to appropriately position electrical signals with respect to each other within a semiconductor integrated chip.

BACKGROUND OF THE INVENTION

Digital signal processing apparatus, such as interface circuits for data storage disk drives or integrated memory circuits frequently require the capability of executing signal processing operations with highly accurate timing, irrespective of the frequency and time of occurrence of a basic system clock that controls the majority of events within a system. Attempting to generate a timing signal asynchronously with respect to the system clock by using multiple occurrences of the clock signal is not necessarily precise, or even possible. This is so particularly where the initiation point of the timing signal is selected at a time that falls immediately subsequent to a transition in the system clock. For example, in a data processing system operating off a precision 20 MHz crystal reference, clock signals occur at intervals of 50 ns. By simply counting five consecutive clock signals one could ostensibly generate a 250 ns. delay pulse. However, if the clock count begins at a time which is slightly subsequent to the most recent clock signals (e.g. 1 ns. later), then the actual time of occurrence of a transition edge of the intended 250 ns. pulse may be retarded by nearly one clock cycle (49 ns. in the example). Because of this inherent uncertainty window in using a fixed system clock, it is common practice to achieve a desired delay using "trimmable" components. Such delay techniques may be in the form of RC delay circuits, monostable multivibrators (one-shots), and precision delay lines. Unfortunately, within a given circuit architecture, the insertion of individual delay components cannot always be readily accomplished and often requires the use of a separate "off-chip" timing circuit. This not only increases hardware complexity, but is subject to drift. Precision delay lines are not subject to the drift problem. However, they add considerable cost and, consequently, are most practically employed in "higher ticket" items such as memories.

With reference to teachings in the field of variable delay signal generating circuits the following art may be considered.

Reference is made to W. J. Stewart U.S. Pat. No. 4,868,430, entitled "Self-Correcting Digitally Controlled Timing Circuit". Stewart discloses a digitally controlled timing circuit for providing an output pulse signal precisely delayed with respect to an input signal irrespective of the time of occurrence of a system clock, but which uses the precision of the system clock to self-correct any inaccuracy in delay. The circuit includes a plurality of delay elements, the delay period of a respective one of which is adjustable, coupled between an input terminal, to which an input terminal is applied, and an output terminal from which a delayed output signal is to be derived.

Stewart teaches how to hard-wire a plurality of digital components to provide a number of pulses within a fixed timing window. If a different number of pulses is desired within the same timing window, reworking of the hardware would be required to conform to the new number of pulses. This could prove costly, time consuming and error prone.

Reference is made to M. C. Swapp U.S. Pat. No. 4,745,310, entitled "Programmable Delay Circuit" which describes a monolithic integrated delay circuit that comprises a gate coupled for receiving a digital input signal. The output of the gate is capacitively loaded whereby the output signal has a sloping downward transition. A line receiver has a first input coupled to the gate and a second input coupled for receiving an analog signal for comparing the analog signal with the output of the gate and for providing a digital signal that is delayed with respect to the input digital signal.

Swapp discloses a programmable delay circuit that combines analog and digital components. Combining analog with digital components has the disadvantage of making more difficult the task of verifying the design through simulation and of automatically testing the complete circuit. Therefore, a purely digital design is preferred in that it can be arrived at quickly by using standard cells which are readily available and which require no special tuning, as would be the case of analog components.

Other U.S. patents are cited hereinafter for reference only to show existing techniques in the art of delaying signals with respect to one another.

Reference is made to Kenji Yoshida U.S. Pat. No. 4,504,749 entitled "Delay Pulse Generating Circuit", whereby a delay signal generating circuit includes feedback loops and components for selectively setting the delay time of a delay unit in one of the loops. The circuit is used to provide an adjustable delay to a signal being propogated therethrough, such that the delay unit can be bypassed.

Reference is made to I. P. Flora et al U.S. Pat. No. 4,755,704, entitled "Automatic Clock De-Skewing Apparatus", which provides a plurality of circuit boards of a data processing system. Each circuit board is of multilayer construction and contains a clock distribution chip which includes on-chip automatic clock de-skewing circuitry for providing de-skewed clocks to other chips on the circuit board.

Reference is made to J. Hullwegen U.S. Pat. No. 4,524,448, entitled "Variable Delay Unit For Data Synchronizer Using Phase-Sensitive Counter to Vary the Delay". Hullwegen describes a signal processing circuit for a signal varying in its properties, e.g., in its degrees of distortion. There, the input signal is fed in parallel to two similar processing circuits, e.g., equalizers, the characteristics of which can be varied by a control signal, such that the control signal of one processing circuit is periodically varied and the output is fed to a detector circuit capable of emitting a trigger pulse to a holding circuit which stores the control signal level to be fed to another processing circuit. A variable delay unit for data is controlled by a continually varying up-down counter, the contents of which continuously vary at the rate of a high frequency clock pulse.

Reference is made to E. Berndlmaier U.S. Pat. No. 4,346,343, entitled "Power Control Means For Eliminating Circuit to Circuit Delay Differences and Providing A Desired Circuit Delay". It describes an on-chip delay regulator circuit which varies the power in logic or array circuits on the same chip so as to eliminate or to minimize chip-to-chip circuit differences caused by power supply variations, lot to lot process differences, temperature, etc. The on-chip delay regulator accomplishes this by comparing a reference signal to an on-chip generated signal which is sensitive to power supply changes, etc. This comparison creates an error signal which is used to change the power supplied to the on-chip circuits.

Reference is made to European Patent Application 0 306 662 to H. J. Greub, entitled "Apparatus For Skew Compensating Signals", which describes a clock signal that is transmitted to the nodes of each of several interconnected synchronous integrated circuits through separate adjustable delay circuits, and such that the time delay of each delay circuit is adjusted so that the clock signal arrives at each node at the same time, thus synchronizing the operation of the separate integrated circuits with one another. Each delay circuit comprises a set of signal delay elements which can be selectively switched into the clock path so that the clock delay signal delay may be adjusted by adjusting the number of signal delay elements in the clock signal path.

Reference is made to UK Patent Application GB 2 040 628 A to A. A. Vacca, entitled "A Clock Pulse Circuit", whereby a clock network for LSI chips of a data handling network comprises a pulse producing circuit on each LSI chip responsive to the leading edge of a master clock signal to produce local clock signals whose pulse durations are dependent at least in part on the manufacturing and environmental conditions of the LSI chip. The pulse producing circuit on each LSI chip consists of a plurality of delay networks and a NOR gate so arranged that the gate is set to produce the leading edges of the local clock pulse coincident with the leading edge of the master clock pulse, and will produce the trailing edge of the local clock pulse upon a delay dependent, at least in part, upon the manufacturing conditions employed in the fabrication of the chip and the environmental conditions to which the chip is subjected.

SUMMARY OF THE INVENTION

The aforementioned references describe a large variety of delay circuits capable of adjusting and self-correcting unwanted skews between one or more electrical signals.

It is known to those skilled in the art, that one may advantageously achieve the desired result by means of analog circuits, either used by themselves or in combination with digital circuits. The disadvantage of using analog circuitry is that they do not integrate well with existing Design Automation tools to help design and simulate their behavior and operation. More relevant yet, they require special handling at the time of testing. It is well known to those familiar with the art of automatically testing integrated chips, that analog and digital circuits do not mix well and often times require two pass testing—one for the digital components and one for the analog portion. This generally translates into higher cost and a more prolonged design cycle, both of which are undesirable.

It is also desired to program delays in variable amounts to skew pulses to one another without having to hard-wire the desired delay within the delay circuitry. Otherwise, its associated cost and impact on design cycle time would become prohibitive.

Accordingly, the present invention may be summarized as an electrical circuit comprised of a plurality of digital circuit components to precisely skew electrical signals with respect to one another. The present invention achieves the desired effect by converting electrical signals into a number of pulses and comparing this number of pulses to a second number of pulses predefined by the user. An unequal comparison generates control signals that advance or retard electrical signals with respect to one another. The delay adjustment takes into consideration variations from lot to lot, temperature and power supply by allowing certain components of the delay circuitry to oscillate freely at their natural frequency. The compounded effect of these variations translates to a certain amount of delay for which self-correction is required.

Thus, it is an object of the present invention to provide an improved digital variable delay circuit.

It is another object of the present invention to self-correct the delay of an electrical signal when compared to another used as a standard.

It is yet another object of the invention to provide means for accounting variations due to process, temperature and power supplies, etc. and to correct for them.

It is a more particular object of the invention to use a recirculating-loop-frequency oscillator (RLF) to determine the impact of the aforementioned factors on the circuit delay.

It is a further object of the present invention to convert pulses whose relative position is to be adjusted and corrected to a number of pulses in accordance with some predefined criterion.

It is yet a further object of the present invention to compare the number of pulses obtained from natural oscillation of circuits within the chip with a predetermined number of pulses to which timing the circuit has to adjust itself to.

The above and other objects, features, and advantages of the present invention will be better understood from the following detailed description taken in conjunction with the accompanying drawings.

BRIEF DESCRIPTION OF THE DRAWINGS

The specific nature of the invention as well as other objects, advantages, uses and features thereof will become evident from the following description in conjunction with the accompanying drawings in which.

DETAILED DESCRIPTION OF THE INVENTION

Figure 1:
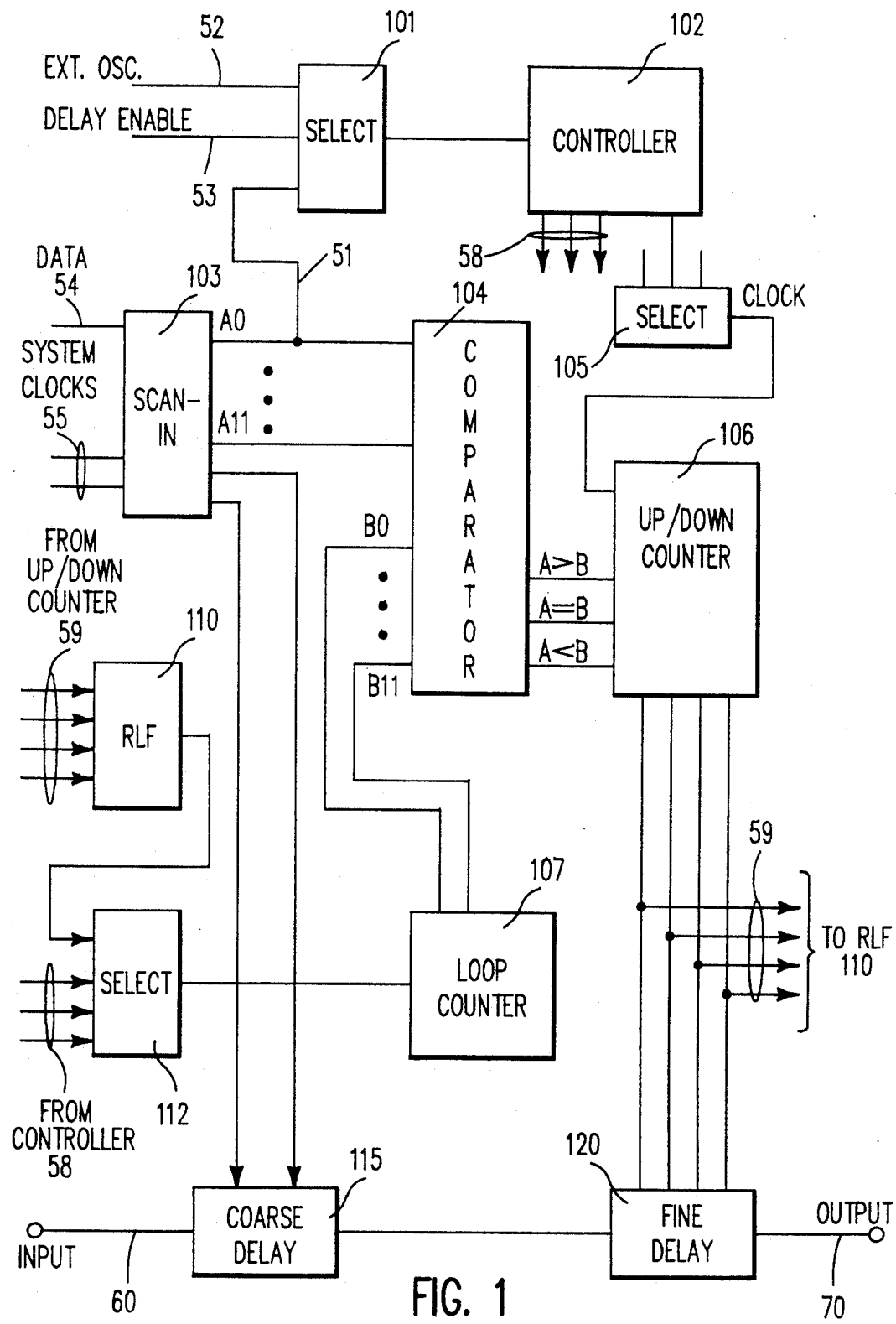
FIG. 1 is an electrical block diagram generally illustrating how delay is introduced in a clock path to precisely position pulses with respect to one another.

FIG. 1 shows a preferred embodiment of the delay circuit according to the present invention.

It is known to practitioners of the art that integrated chips, particularly those affecting the clocking of a system, can be designed with a certain degree of flexibility. Designers can select a predetermined delay setting, henceforth to be referred as "user adjusted", based on system timing requirements and chip parameters. Moreover, the relative skew between electrical signals entering, for instance, an array often times requires precise positioning of one signal with respect to another. However, external factors which are beyond the control of a designer, such as power supply, temperature or process variations may affect the relative skew of the various signals. To this end, a circuit is described that is provided with appropriate internal settings to compensate for these unwanted variations, and capable of "self-correcting". In order to restore the signals to their intended relative position, two controllable delay blocks, a coarse delay 115 and a fine delay adjustment 120 are added to the clock path 60–70. Their intended purpose is to shift clock pulses by precise amounts, either by advancing or retarding these clock pulses with respect to other pulses entering the array, such as addresses or data pulses. The user defines the direction of the adjustment, either positive or negative, as well as the amount of the time increment he wishes to introduce in the path. Moreover, it is evident that any time adjustments need to be completely automated and free of manual intervention.

The waveform of an external oscillator (not shown) that regulates the system is inputted via line 52 to a select circuit 101 that is gated by two additional inputs: by line 51, the output of scan-in shift-register 103, that indicates when delay data entered by the user has been appropriately entered into the scan-in shift register 103, and by a second input, delay enable (line 53), that indicates if a delay adjustment is or is not required. When both inputs are at the appropriate logic level, the waveform provided by the external oscillator exiting the select circuit 101 is inputted to the controller 102. Shift-register 103, which is also referred to as shift-register chain 103, contains the desired amount of delay which the "user" or the "system designer" enters via data input terminal 54. The object of the controller 102 is to ensure that the recirculating loop-frequency oscillator (RLF) 110 and the loop counter 107 both start at the same time, serving also the purpose of resetting all the counters and latches.

Controller 102 is, preferably, a 4-stage counter that normally counts from 0 to 15, i.e., from binary 0000 to 1111. The plurality of states taken by the controller provides a window in the form of a pulse that, preferably, starts at count 2 and ends at count 12. The up-down counter 106 is comprised of a plurality of J-K flip-flops, preferably 4, and is controlled by a selector circuit 105 that provides the necessary internal clocking controls.

The RLF 110, commonly comprised of an odd number of inverters is designed to allow additional circuits to be added and subtracted to its recirculating loop. It is evident to those skilled in the art that by serially adding or subtracting gates to the RLF as a function of the count shown in the up/down counter 106, the frequency of oscillation will correspondingly decrease or increase. Circuitry shown by blocks 150 through 185 described below (FIG. 2), adds or subtracts a plurality of gates to the basic RLF loop based on the count indicated by the outputs of the up/down counter 106, shown as lines 59.

The output of the RLF is gated by a second select circuit 112, that is controlled by the outputs of controller 102, shown as lines 58, which signal the opening and closing of the timing window. The output of the RLF 110, if enabled by select circuit 112, is inputted to loop counter 107. The number of pulses in the loop counter provides a measurement of gate delay in accordance with the following relationship:

$$\text{\# of pulses} = \text{gate delay}/\text{RLF period} \quad \text{(eq. 1)}$$

More specifically, gate delay is equivalent to the aforementioned ten timing slots of the controller 102, thus matching the size of its timing window (FIG. 3). The RLF period is the amount of time from one rising (or falling) RLF pulse to the next rising (or falling) pulse. Time delay is defined as the amount of delay the user may wish to shift the original trigger clock prior to performing another logic function and is equivalent to half of the RLF period. By way of example, an external clock (not shown), running at 10 MHz, i.e., with a period of 100 ns. and an RLF, running at 100 MHz, i.e., with a period of 10 ns., will return 10 pulses, according to equation 1. If more pulses are counted, the delay adjustment circuitry will be activated, adding the delay necessary to restore the count to 10. Correspondingly, if less than 10 pulses are counted, delay will have to be subtracted to return to the expected 10 pulses.

The delay adjustments that are required and that indirectly control the number of pulses are determined by the scan-in register 103, by the comparator 104 and by the up-down counter 106. Delay data is entered serially into the scan-in shift register 103 at a speed determined by the system clocks, (not shown) via input lines 55. The scan-in register consists, preferably, of a 15 stage serial-to-parallel latch, such that the outputs of stages 1 through 12 are used for comparison with the corresponding bits issued by the loop counter 107, while the remaining, preferably, three stages are used to provide the shifted clock pulse path with a coarse delay (block 115). The data is outputted in parallel from the scan-in shift-register 105 to a comparator circuit 104, where a bit by bit comparison of the scanned-in data A, comprised of bits $A_0, \ldots, A_i$ is made to the pulses of the loop counter B, comprised of bits $B_0, \ldots, B_i$ takes place.

Data is inputted via lines 54 by the user who determines the amount of delay that is desirable to introduce. By way of example, let it be assumed that the window provided by the controller 102 is 1000 ns. wide. The loop counter provides, say 25 pulses implying a RLF Period of 40 ns, thus a path delay of 20 ns. Consequently, the delay data A to be entered serially by the user is 25. Comparator 104 compares the parallel output of the scan-in register 103, i.e., binary 11001, to the corresponding binary representation of the loop counter 107. If the output of the loop counter 107 were, say, 11010 (i.e., decimal 26) it would imply that the RLF is oscillating faster than it should, and retarding it by one pulse would then be required (Condition B>A). Incrementing the up-down counter 106 by a count of 1 will introduce a precise amount of delay in the RLF, leading to an adjustment in the delay path of 1 pulse. Similarly, a binary representation of the condition A>B will correspondingly translate to a slower circuit operation. Thus, it is apparent from the aforementioned discussion that factors as diverse as power supply, process, and temperature variations will be fully accounted for, since they are the factors that will determine the natural frequency of oscillation of the RLF.

Considering now a more detailed second example: a user decides that it is needed to shift original clock pulses by 2.0 ns. A 0 is entered in the scan-in register 103 which enables the delay adjust circuitry. Bits 1, 2, and 3 of the scan-in register that control the course delay circuit 115 are then set in accordance to the table below:

| SCAN BITS | | | DELAY |
|---|---|---|---|
| 1 | 2 | 3 | ns. |
| 0 | 0 | 0 | 0.5 |
| 0 | 0 | 1 | 1.0 |
| 0 | 1 | 0 | 1.5 |
| 0 | 1 | 1 | 2.0 |
| 1 | 0 | 0 | 2.5 |
| 1 | 0 | 1 | 3.0 |
| 1 | 1 | 0 | 3.5 |
| 1 | 1 | 1 | 4.0 |

According to the above table, a delay of 2.0 ns. corresponds to scan bits 011. These bits are entered sequentially in the scan-in register 103 and fed to the coarse delay circuit 115. At this point, the number of counts in the comparator needs to be determined. Assuming an external oscillator frequency of 10 MHz and a count window at the controller 102 of 10 time units (100 ns × 10), according to equation 1, a count of 250 pulses (1000 ns/4.0 ns—if delay through is 2.0 ns, then the period equals 2 × 2.0 ns = 4.0 ns) will be expected. Thus, the binary representation of 250 is entered next in the scan-in register 103 and is passed to comparator 104. As yet, no attempts for a delay adjustment have been made. The timer is set in motion. The first bit 0 activates select circuit 101, allowing the waveform of the external oscillator to pass through to the controller 102. The various waveforms, triggered by the oscillator and outputted by the 4-stage controller 102, are shown in FIG. 3. The gate timer circuit, illustrated in FIG. 3B establishes a window of precisely 10 counts, starting at point D (0010, equivalent to decimal 2) and ending at point E (1100, decimal 12). The adjust delay circuit 115 remains in operation until the comparator produces an "equal" sign (A = B). At this point, the RLF, which is oscillating at a frequency determined by the number of stages in the loop, by power supply, temperature and process variations, is active only during the time when the controller's window is opened, and inactive as soon as that window closes. Assuming that the count returned by the loop counter 107 is 240, this count is fed to comparator 104 and is compared with binary 250 from data A. Thus, A > B indicates that the signal needs to be decremented. Delay adjustments are made at this time, (controller time 13, i.e., 1300 ns) at the RLF and at the delay adjustment block 120 on the data path 60-70. The loop counter 107 is reset and the loop counter is put once again in motion. The process is initiated a second time by the controller 102 and is repeated until the count of the RLF matches that of the data. When this condition is reached, the delay enable 53 inhibits the select circuit 101 from letting the waveform of the external oscillator set the controller 102 in motion and the delay adjustment comes to an end.

Figure 2:
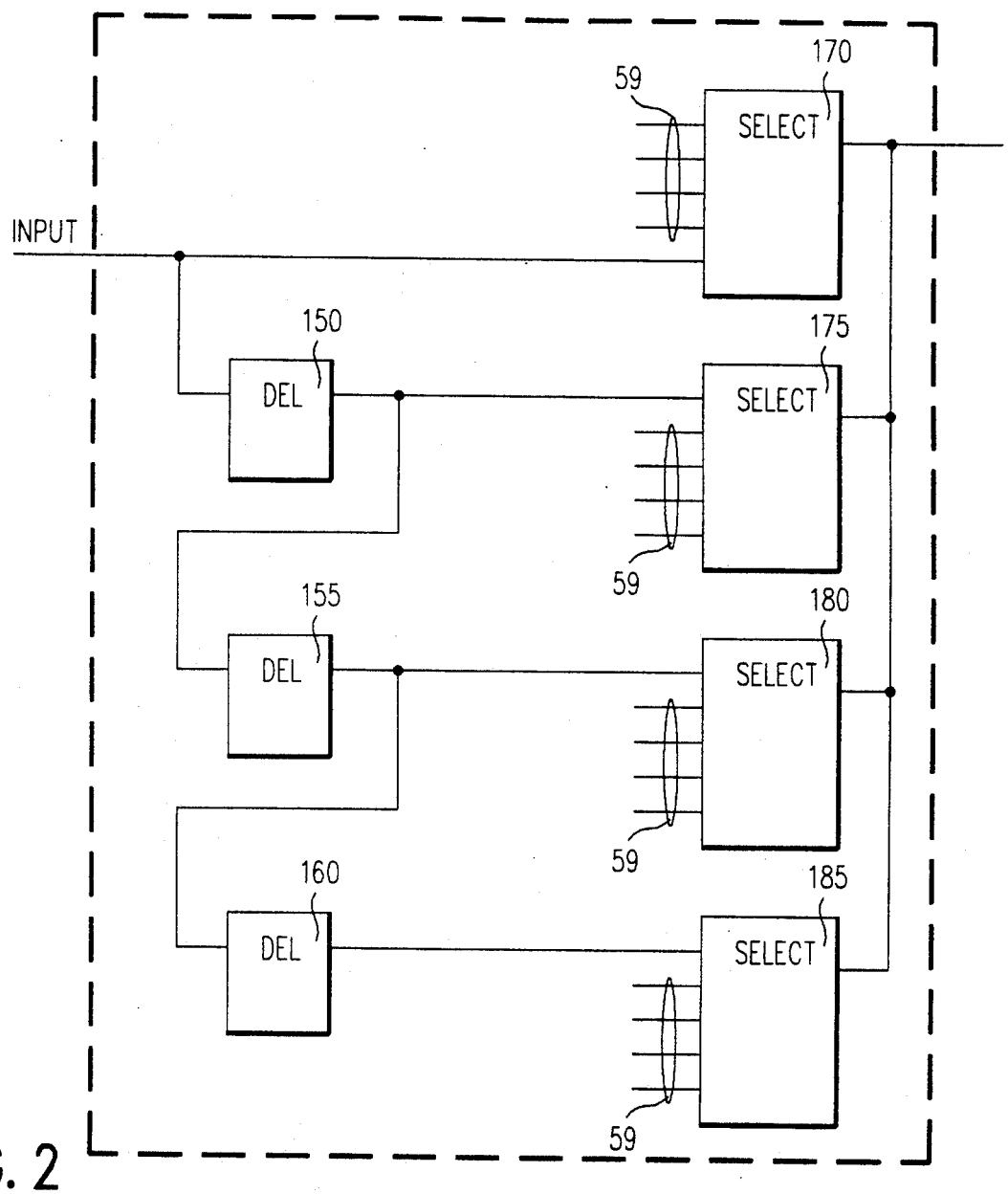
FIG. 2 is an electrical block diagram showing in more detail how one or more circuits are added or subtracted to the recirculating-loop-frequency (RLF) circuit and/or to the coarse and fine delay circuits to achieve the desired skew between pulses.

FIG. 2 shows a schematic representation of a plurality of logic blocks that can be added (or subtracted) from the RLF loop. Gates 150, 155 and 160 provide 1, 2 and 3 gate delays. They are, respectively, controlled by select circuits 170, 175, 180 and 185. When no gate is to be added to the RLF loop, gate 170 is activated, leaving 175, 180 and 185 inactive. It is evident to those skilled in the art, that any plurality of gates can thus be added to the loop, modifying in this manner the frequency of oscillation of the RLF, which translates to a different pulse count at the loop counter 107.

Delays means 115 and 120 are delay circuits well known to the art to provide coarse and fine delay, respectively. Practitioners of the art will readily appreciate that such delay circuits can be implemented in a variety of ways, one of which is shown in FIG. 2.

Figure 3C:
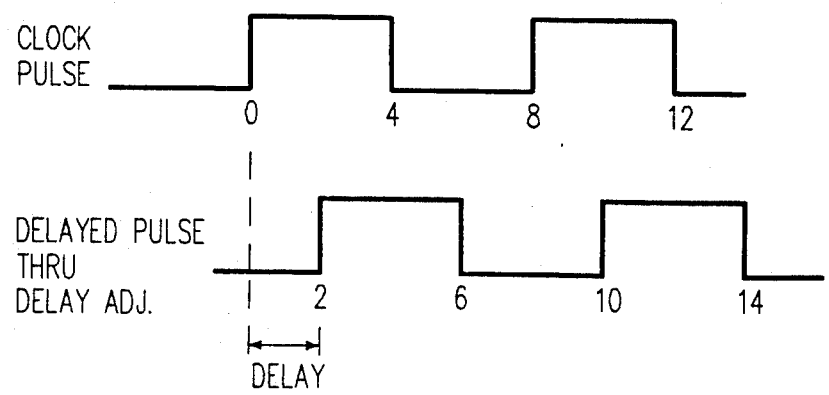
FIG. 3C is the original pulse after undergoing a delay adjustment.
Figure 3A:
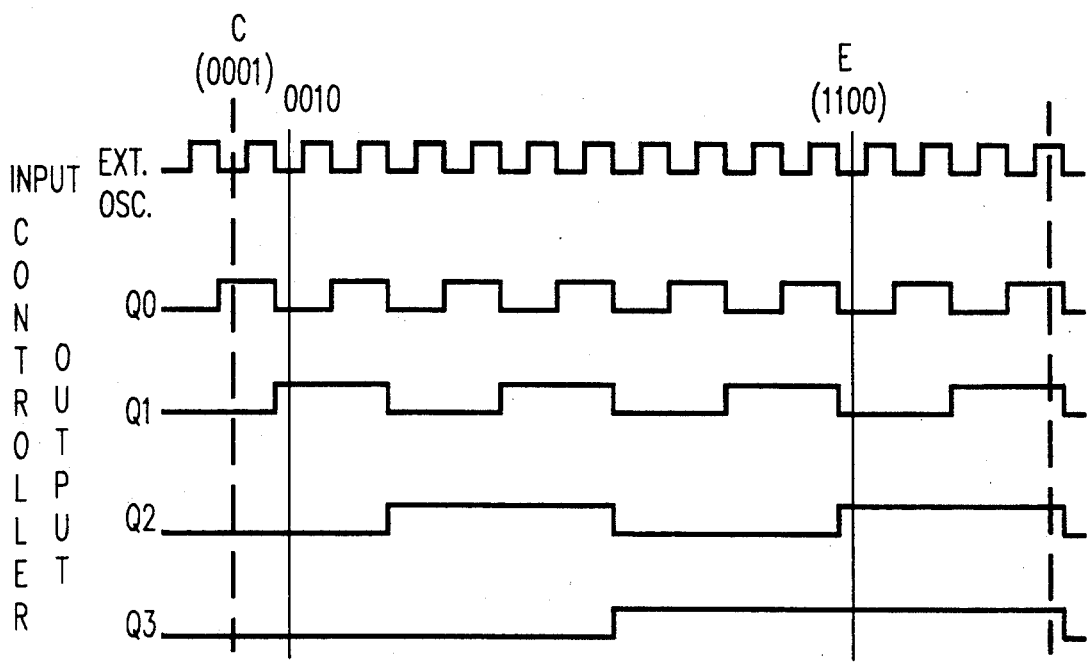
FIG. 3A shows a timing diagram at the output of the 4-stage controller.
Figure 3B:
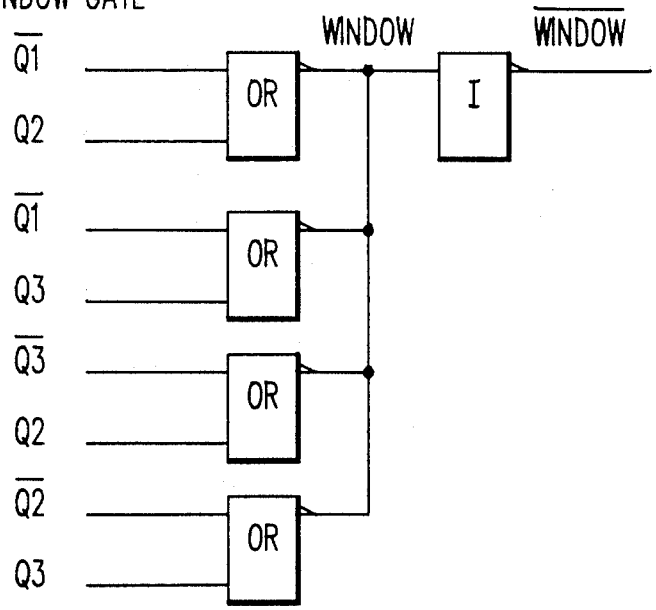
FIG. 3B is a schematic of a sample circuit that provides the timing window.
Figure 3B:
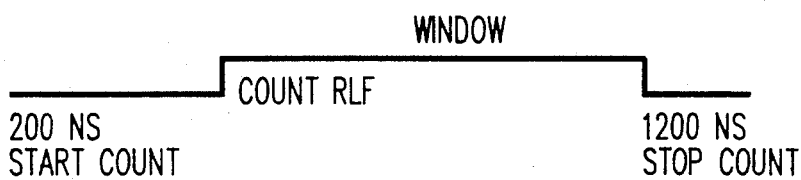

Referring now to FIG. 3A, there is shown a timing diagram comprised of a train of pulses outputted at each stage of the controller 102. The aforementioned timing window starts at point C (binary 0010, equivalent to digital 2) and ends at point E (binary 1100, i.e., digital 12). If the clock is running at 10 MHz, this translates to 200 ns, ending at 1200 ns. A preferred circuit to provide a window precisely equal to 10 counts is shown in FIG. 3B. It is evident that the time interval between 0 ns and 1500 ns can be advantageously subdivided to perform the several functions required to make the necessary delay adjustments. Thus, between times 0-200 ns., all counters can be reset, between 1300-1400 ns, all adjustments to the RLF and delay blocks can be made, between 1400-1500 ns., all circuits can be appropriately reset, etc.

Finally, FIG. 3C shows the final pulse, outputted at line 70 (FIG. 1), delayed with respect to the original clock pulse (inputted at line 60), by the coarse delay block 115 and by the fine delay block 120.

Although the present invention has been described with reference to a particular preferred embodiment, it is to be understood that various modifications in implementation, construction, arrangement and use are possible without departing from the true scope and spirit of the present invention. Thus, shift-registers, ring counters, etc., could have been used advantageously instead of the digital components described therein. Moreover, the coarse and fine delay circuits could be inserted to any clock/data path or within the RLF oscillator, or to both, if desired. Accordingly, the present invention is to be considered as encompassing all possible modifications and variations coming within the scope of the appended claims.

What is claimed is:

1. A monolithic integrated variable self-correcting delay circuit having a plurality of components thereon for producing an output signal, the time of occurrence of which is delayed by precise amounts with respect to an input signal applied thereto, wherein a user determines the amount of delay that is desirable to introduce, comprising:

oscillator means to generate signals having a frequency of oscillation;

first counter means coupled to said oscillator means to convert said frequency of oscillation into a first number of pulses;

circuit means for receiving a data input signal indicative of the desired delay determined by the user and for converting said input signal into a second number of pulses;

comparator means connected to said first counter means and to said circuit means to compare said first number of pulses to said second number of pulses;

second counter means responsive to said comparator means and driving said oscillator means for providing a signal that modifies the frequency of oscillation of said oscillator means; and delay means responsive to said circuit means and to said second counter means for providing the desired delay introduced by the user.

2. The monolithic integrated variable self-correcting delay circuit as in claim 1 is further characterized by being comprised of only digital components.

3. The monolithic integrated variable self-correcting delay circuit as in claim 1 is further characterized by having said first number of pulses of said first counter means vary as a function of delay caused by technology, process, temperature and power supply variations.

4. The monolithic integrated variable self-correcting delay circuit as in claim 1, wherein said first counter means counts said first number of pulses in accordance with the following relationship:

Number of pulses=amount of delay/first counter means period, wherein said amount of delay corresponds to said desired delay.

5. The monolithic integrated variable self-correcting delay circuit as in claim 4, wherein said second number of pulses is inputted into said comparator means for comparison with said first number of pulses to determine the amount of correction to the frequency of said oscillator means.

6. The monolithic integrated variable self-correcting delay circuit as in claim 5, wherein said second counter means comprises an up/down counter, the content of which is incremented or decremented in accordance with the outcome of said comparison in said comparator means, and wherein said first number of pulses is, respectively, above or below said second number of pulses.

7. The monolithic integrated variable self-correcting delay circuit as in claim 1, wherein said first counter means comprises a loop counter to reflect contemporaneously changes in said frequency of oscillation caused by advancing or retarding the output signal with respect to the input signal in accordance with said delay means.

8. The monolithic integrated variable self-correcting delay circuit as in claim 1, wherein the delay provided by said delay means between an output and an input signals is determined by a coarse delay and by a fine delay circuit means, the input of said coarse delay means is attached to an input terminal and the output of said fine delay is attached to an output terminal, and wherein said coarse delay is responsive to the amount of delay determined by the user, the said fine delay is controlled by said second counter means.

9. A monolithic integrated variable self-correcting delay circuit having a plurality of components thereon for producing an output signal, the time of occurrence of which is delayed by precise amounts with respect to an input signal applied thereto, wherein the user determines the amount of delay that is desirable to introduce, comprising:

recirculating-loop-frequency oscillator means for generating signals having a frequency of oscillation determined by the monolithic integrated variable self-correcting delay circuit;

first counter means responsive to said recirculating-loop-frequency oscillator means having a plurality of outputs for converting said frequency of oscillation into a first number of pulses;

select circuit means having at least two inputs and one output, the first of said at least two inputs is connected to an oscillator, and the second to a delay enable signal, said select circuit means setting the monolithic integrated variable self-correcting delay circuit in a delay mode;

controller circuit means responsive to said select circuit means for defining a time window during which said first pulses are counted;

data scan-in circuit means for receiving a data signal indicative of the desired delay determined by the user and for converting said input signal into a second number of pulses, said data scan-in circuit means having at least two inputs and a plurality of outputs, the first of said two inputs is connected to a clock and the second input for receiving said data signals;

comparator means responsive to said data scan-in circuit means and to said first counter means to compare said first number of pulses to said second number of pulses second counter means responsive to said comparator means and driving said recirculating-loop-frequency oscillator means for providing a signal to vary the delay indicated by the data scan-in circuit means, thereby modifying the frequency of oscillation of said recirculating-loop-frequency oscillator means; and timing adjustment means coupled to said first and second counter means for advancing or retarding the output signal with respect to the input signal in accordance with the lapse of time defined by the outcome of the comparison of said first number of pulses to said second number of pulses.

10. The monolithic integrated variable self-correcting delay circuit as in claim 9, wherein said first number of pulses are counted within said time window set by said controller circuit means and wherein said second number of pulses is determined by said data scan-in circuit means.

11. The monolithic integrated variable self-correcting delay circuit as in claim 9, wherein said first counter means counts said first number of pulses in accordance with the following relationship:

Number of pulses=amount of delay/first counter means period, wherein said amount of delay corresponds to said desired delay.

12. The monolithic integrated variable self-correcting delay circuit as in claim 9, wherein said first counter means is connected to the output of a select circuit means which inputs are coupled to the output of said recirculating-loop-frequency means and to outputs of said controller circuit means.

* * * * *